(12) United States Patent
Hirabayashi

(10) Patent No.: US 7,477,561 B2
(45) Date of Patent: Jan. 13, 2009

(54) SEMICONDUCTOR MEMORY DEVICE

(75) Inventor: Osamu Hirabayashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/434,064

(22) Filed: May 16, 2006

(65) Prior Publication Data
US 2007/0247941 A1 Oct. 25, 2007

(30) Foreign Application Priority Data
Mar. 13, 2006 (JP) ............................. 2006-067989

(51) Int. Cl.
G11C 7/02 (2006.01)
(52) U.S. Cl. ................ 365/210.1; 365/208; 365/189.09; 365/154
(58) Field of Classification Search .................. 365/210, 365/207, 203, 188, 154, 156, 210.1, 208, 365/189.9, 226
See application file for complete search history.

(56) References Cited

U.S. PATENT DOCUMENTS

| | | | | |
|---|---|---|---|---|
| 4,833,341 | A * | 5/1989 | Watanabe et al. | 327/541 |
| 6,717,842 | B2 * | 4/2004 | Watanabe et al. | 365/154 |
| 6,845,049 | B2 * | 1/2005 | Lim et al. | 365/194 |
| 7,236,396 | B2 * | 6/2007 | Houston et al. | 365/185.07 |
| 2002/0186579 | A1 * | 12/2002 | Yokozeki | 365/154 |
| 2005/0232054 | A1 * | 10/2005 | Yamaoka et al. | 365/226 |
| 2005/0278594 | A1 | 12/2005 | Hirabayashi | |
| 2006/0050586 | A1 * | 3/2006 | Ohtsuki et al. | 365/210 |

OTHER PUBLICATIONS

David A. Johns et al., Analog Integrated Circuit Design, 1997, By John Wiley & Sons, Inc., ISBN:0-471-14448-7.*
Bharadwaj S. Amrutur, et al., "A Replica Technique for Wordline and Sense Control in Low-Power SRAM's", IEEE Journal of Solid-State Circuits, vol. 33, No. 8, Aug. 1998, pp. 1208-1219.
Kenichi Osada, et al., "Universal-Vdd 0.65-2.0V 32kB Cache using Voltage-Adapted Timing-Generation Scheme and a Lithographical-Symmetric Cell", ISSCC 2001, Session 11, SRAM, 11.1, Feb. 6, 2001, 3 pages.

* cited by examiner

Primary Examiner—Amir Zarabian
Assistant Examiner—Fernando N Hidalgo
(74) Attorney, Agent, or Firm—Oblon, Spivak, McClelland, Maier & Neustadt, P.C.

(57) ABSTRACT

A semiconductor memory device includes a memory cell array including memory cells, word lines which select the memory cells, bit lines which transfer data of the memory cells, a sense amplifier circuit which amplifies data transferred to the bit lines, a first dummy cell group including first dummy cells, a dummy word line which selects the first dummy cell group, a dummy bit line to which data of the first dummy cell group is transferred, a generation circuit which generates an activation signal to activate the sense amplifier circuit based on a variation in a potential level of the dummy bit line, and a potential generating circuit which generates a first source potential applied to the first dummy cell group. The first source potential is different from a power supply potential.

13 Claims, 13 Drawing Sheets

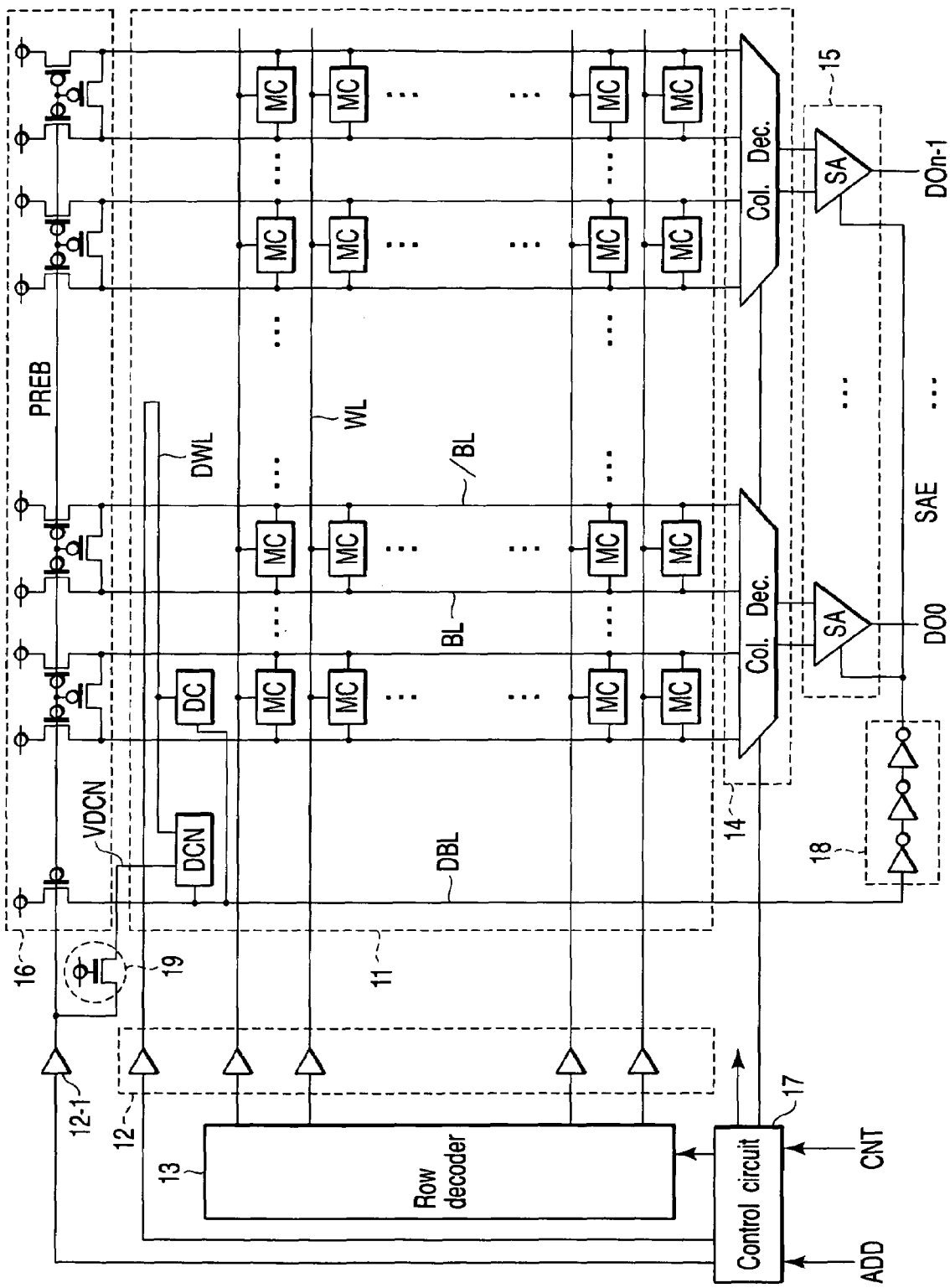
F I G. 1

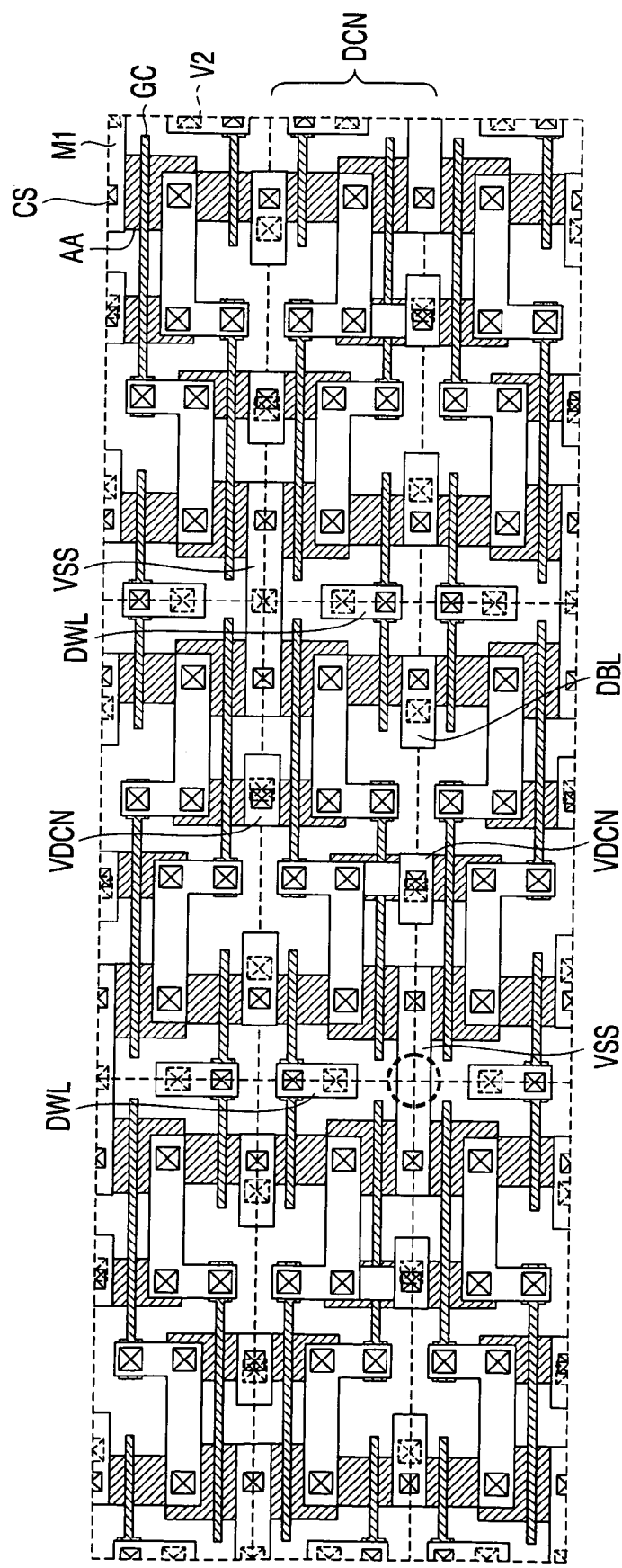
F I G. 10

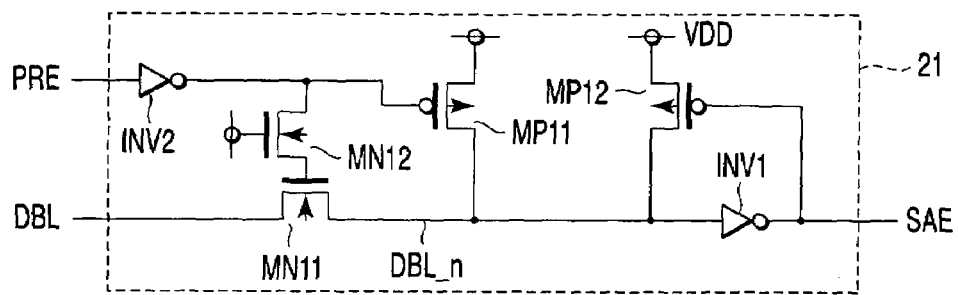
F I G. 19
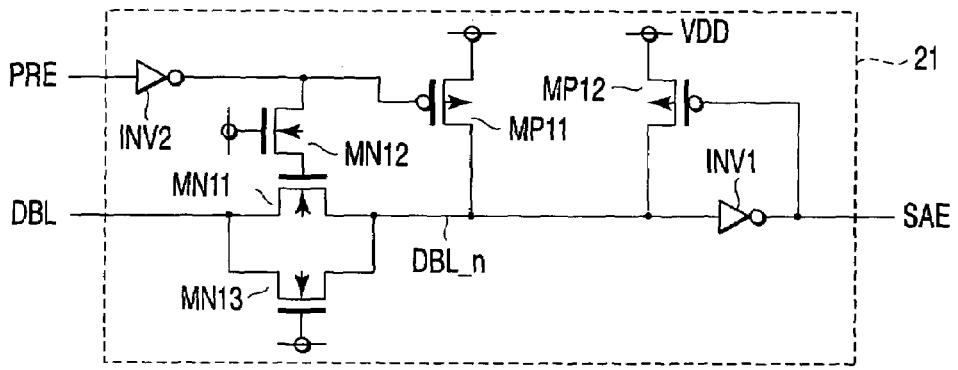
F I G. 20
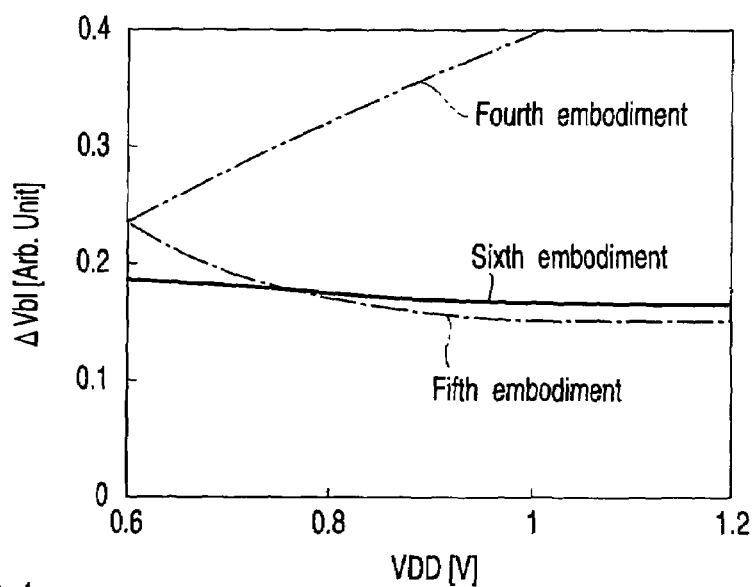
F I G. 21

SEMICONDUCTOR MEMORY DEVICE

CROSS-REFERENCE TO RELATED APPLICATIONS

This application is based upon and claims the benefit of priority from prior Japanese Patent Application No. 2006-067989, filed Mar. 13, 2006, the entire contents of which are incorporated herein by reference.

BACKGROUND OF THE INVENTION

1. Field of the Invention

The present invention relates to a semiconductor memory device and more particularly to a static random access memory (SRAM) having static memory cells.

2. Description of the Related Art

In a system large-scale integrated circuit (LSI), memories having various memory capacities, word numbers and bit numbers are used. In the memories, SRAM macros prepared to permit memory macros with desired configurations to be formed by use of common unit blocks are used.

In the above SRAM macro, complementary data transferred from an SRAM cell to a bit line pair is amplified by use of a sense amplifier and output to the exterior. For example, as the sense amplifier, a synchronous type sense amplifier is used to attain a high-speed operation. The synchronous type sense amplifier amplifies data with minute amplitude in synchronism with a sense amplifier activation signal SAE.

Therefore, it is desirable to set the SAE timing as early as possible to attain the high-speed operation, but if the signal SAE is activated too early, an input potential difference supplied from the bit line pair to the sense amplifier does not become sufficiently large and the SRAM is erroneously operated. Therefore, it is important to set optimum SAE timing for the high-speed operation.

However, since the bit line delay and word line delay are changed accordingly if the bit line length, word line length and the like are changed, the optimum SAE timing is changed according to the macro configuration. In order to cope with the above problem, a method for generating a signal SAE by use of dummy cells, dummy word line and dummy bit line is used (reference document: Kenichi Osada et al., "Universal-Vdd 0.65-2.0V 32 kB Cache using Voltage-Adapted Timing-Generation Scheme and a Lithographical-Symmetric Cell", 2001 ISSCC (International Solid-State Circuits Conference)/SESSION 11/SRAM 11.1).

The problem of the conventional timing generation method lies in the fact that the SRAM macro cannot be operated by use of power supply potentials of a wide range. When the power supply potential is gradually lowered, the data path delay rapidly becomes longer than the dummy bit line delay. The dummy bit line delay is a time period from the time the dummy word line potential is set to a high level until the potential of the dummy bit line swings to the threshold voltage (for example, approximately VDD/2) of the inverter circuit. Further, the data path delay is a time period from the time the word line potential is set to a high level until a potential difference (for example, approximately 100 mV) which can be sensed by the sense amplifier appears between the paired bit lines.

Therefore, the input potential difference at the sense amplifier activation time is more reduced as the power supply potential becomes lower. Since the minimum input potential difference required for the sense operation is caused by input offset voltage or the like of the sense amplifier due to a fluctuation in the manufacturing process, it is kept substantially constant even if the power supply potential becomes low. Therefore, if the input potential difference is reduced when the power supply potential is set at the low level, an erroneous operation occurs. If the dummy bit line delay is made longer in order to prevent occurrence of the erroneous operation when the power supply potential is set at the low level, the operation speed when the power supply potential is set at the high level is lowered.

Thus, with the conventional timing generation method, there occurs a problem that the SRAM macro cannot be operated by use of power supply potentials of a wide range without degrading the operation speed.

BRIEF SUMMARY OF THE INVENTION

According to a first aspect of the present invention, there is provided a semiconductor memory device comprising: a memory cell array including a plurality of memory cells, each memory cell being of a static type and configured by metal insulator semiconductor (MIS) transistors; a plurality of word lines which select the memory cells; a plurality of bit lines which transfer data of the memory cells; a sense amplifier circuit which amplifies data transferred to the bit lines; a first dummy cell group including a plurality of first dummy cells, each first dummy cell being configured by MIS transistors and having data fixed therein; a dummy word line which selects the first dummy cell group; a dummy bit line to which data of the first dummy cell group is transferred; a generation circuit which generates an activation signal to activate the sense amplifier circuit based on a variation in a potential level of the dummy bit line; and a potential generating circuit which generates a first source potential applied to the first dummy cell group. A power supply potential is applied to the memory cells. The first source potential is different from the power supply potential.

According to a second aspect of the present invention, there is provided a semiconductor memory device comprising: a semiconductor memory device comprising: a memory cell array including a plurality of memory cells, each memory cell being of a static type and configured by MIS transistors; a plurality of word lines which select the memory cells; a plurality of bit lines which transfer data of the memory cells; a sense amplifier circuit which amplifies data transferred to the bit lines; a dummy cell group which includes a plurality of dummy cells, each dummy cell being configured by MIS transistors and having data fixed therein; a dummy word line which selects the dummy cell group; a dummy bit line to which data of the dummy cell group is transferred; and a detection circuit which detects that a potential amplitude of the dummy bit line is changed to a constant level independent of a power supply potential, and generates an activation signal to activate the sense amplifier circuit.

BRIEF DESCRIPTION OF THE SEVERAL VIEWS OF THE DRAWING

FIG. 1 is a block diagram illustrating the configuration of an SRAM according to a first embodiment of this invention;

FIG. 10 is a layout diagram illustrating a dummy cell DCN when horizontally long SRAM cells are used;

FIG. 19 is a circuit diagram illustrating the configuration of a level detection circuit 21 according to a fifth embodiment of this invention;

FIG. 20 is a circuit diagram illustrating the configuration of a level detection circuit 21 according to a sixth embodiment of this invention; and FIG. 21 is a diagram illustrating the dependency of the bit line potential difference $\Delta Vb1$ at the sense amplifier activation time on the power supply potential.

DETAILED DESCRIPTION OF THE INVENTION

Figure 2:
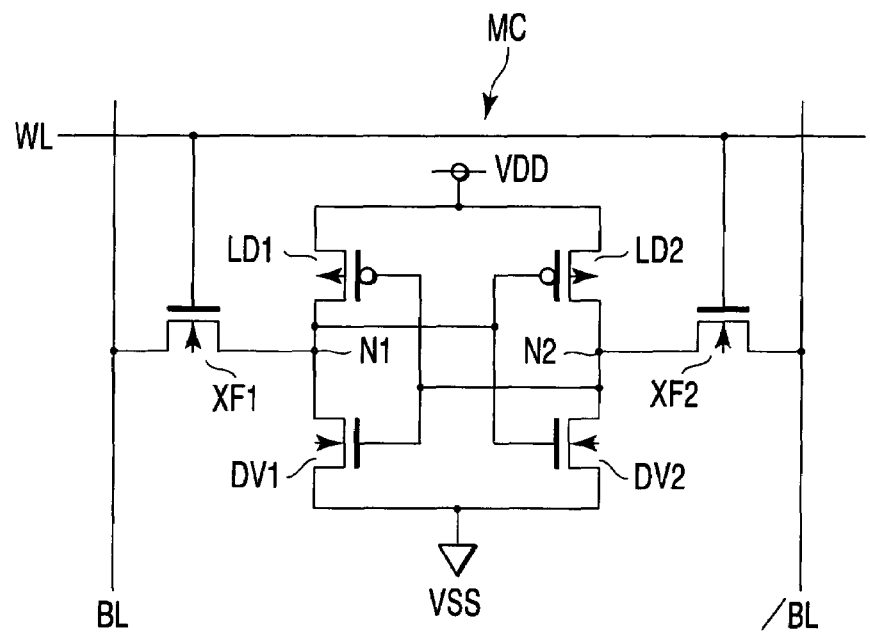
FIG. 2 is a circuit diagram illustrating the configuration of a memory cell MC.

There will now be described embodiments of this invention with reference to the accompanying drawings. In the following explanation, the same reference symbols are attached to elements having the same functions and configurations and the repetitive explanation thereof is made only when required.

FIRST EMBODIMENT

FIG. 1 is a block diagram illustrating the configuration of an SRAM according to a first embodiment of this invention. The SRAM shown in FIG. 1 is mainly shown with the readout system. The SRAM includes a memory cell array 11 configured by a plurality of static memory cells MC. In the memory cell array 11, a plurality of word lines WL are arranged to extend in a row direction. Further, in the memory cell array 11, a plurality of paired bit lines BL, /BL are arranged to extend in a column direction. Selection of a row of the memory cell array 11 is made by use of a word line WL. Selection of a column of the memory cell array 11 is made by use of a bit line pair BL, /BL.

A plurality of word lines WL are connected to a row decoder 13 via a word line driver circuit 12. The row decoder 13 selects a corresponding one of the word lines WL based on a row address signal.

A plurality of bit line pairs BL, /BL are connected to a column decoder (Col. Dec.) 14. The column decoder 14 selects a corresponding one pair of the bit line pairs BL, /BL based on a column address signal.

A sense amplifier circuit 15 is configured by a plurality of sense amplifiers SA. The sense amplifier circuit 15 senses and amplifies data read out from the memory cell array 11 via a column decoder 14 and outputs the thus amplified data as output data items DO0 to DOn-1.

A precharge circuit 16 precharges bit line pairs BL, /BL to, for example, power supply potential VDD before the read operation and write operation are performed (that is, before data is transferred to the bit line pair BL, /BL). The precharge circuit 16 performs the precharge operation based on a precharge signal PREB. The precharge signal PREB is supplied to the precharge circuit 16 from a control circuit 17 via a driver 12-1.

The precharge signal PREB is set at the low level in the precharge state and set at the high level in the non-precharge state. That is, the precharge circuit 16 precharges the bit line pair BL, /BL to the power supply potential VDD when the precharge signal PREB is set at the low level and releases the precharge state when the precharge signal PREB is set at the high level.

The control circuit 17 controls the respective circuits in the SRAM. The control circuit 17 is supplied with an address signal ADD, control signal CNT and the like from the exterior. The control circuit 17 generates a row address signal supplied to the row decoder 13 and a column address signal supplied to the column decoder based on the address signal ADD. Further, the control circuit 17 generates a precharge signal PREB supplied to the precharge circuit 16 based on the control signal CNT, for example.

FIG. 2 is a circuit diagram illustrating the configuration of the memory cell MC contained in the memory cell array 11 shown in FIG. 1. The memory cell MC includes first and second inverter circuits. The first inverter circuit includes a load P-channel metal oxide semiconductor (MOS) transistor (PMOS transistor) LD1 and driving N-channel MOS transistor (NMOS transistor) DV1.

In this embodiment, a MOS transistor is used as one example of a metal insulator semiconductor (MIS) transistor. The PMOS transistor LD1 and NMOS transistor DV1 are serially connected between the power supply potential VDD (or a terminal to which the power supply potential VDD is applied) and the ground potential VSS (or a terminal to which the ground potential VSS is applied).

The second inverter circuit includes a load PMOS transistor LD2 and driving NMOS transistor DV2. The PMOS transistor LD2 and NMOS transistor DV2 are serially connected between the power supply potential VDD and the ground potential VSS.

Specifically, the source terminal of the PMOS transistor LD1 is set at the power supply potential VDD. The drain terminal of the PMOS transistor LD1 is connected to the drain terminal of the NMOS transistor DV1 via a memory node N1. The gate terminal of the PMOS transistor LD1 is connected to the gate terminal of the NMOS transistor DV1. The source terminal of the NMOS transistor DV1 is set at the ground potential VSS.

The source terminal of the PMOS transistor LD2 is set at the power supply potential VDD. The drain terminal of the PMOS transistor LD2 is connected to the drain terminal of the NMOS transistor DV2 via a memory node N2. The gate terminal of the PMOS transistor LD2 is connected to the gate terminal of the NMOS transistor DV2. The source terminal of the NMOS transistor DV2 is set at the ground potential VSS.

Further, the gate terminal of the PMOS transistor LD1 is connected to the memory node N2. The gate terminal of the PMOS transistor LD2 is connected to the memory node N1. In other words, the output terminal of the first inverter circuit is connected to the input terminal of the second inverter circuit. The output terminal of the second inverter circuit is connected to the input terminal of the first inverter.

The memory node N1 is connected to the bit line BL via a transfer NMOS transistor XF1. The gate terminal of the NMOS transistor XF1 is connected to the word line WL. The memory node N2 is connected to the bit line /BL via a transfer NMOS transistor XF2. The gate terminal of the NMOS transistor XF2 is connected to the word line WL.

In the memory cell array 11, a dummy word line DWL is arranged to extend in the row direction like the word lines WL. The dummy word line DWL is arranged in the end portion of the memory cell array 11 which lies farthest from the sense amplifier circuit 15 with the sense amplifier circuit 15 set as a reference. By thus arranging the dummy word line, the dummy word line DWL can reproduce delay caused when the memory cell connected to that one of the normal word lines WL which lies farthest from the sense amplifier circuit 15 is selected.

One end of the dummy word line DWL is connected to the control circuit 17 via a word line driver circuit 12. The control circuit 17 activates the dummy word line DWL at the same time that the normal word line WL is activated.

For example, the dummy word line DWL is folded at substantially the central portion of the memory cell array 11 and a preset number of dummy cells DC and a preset number of dummy cells DCN are connected in parallel to the folded portion of the dummy word line DWL. By folding the dummy word line DWL at substantially the central portion of the memory cell array 11, the wiring length thereof is set substantially equal to that of the normal word line WL. Further, the wiring width of the dummy word line DWL is set substantially equal to that of the normal word line WL.

The SRAM has a dummy bit line DBL arranged in parallel to the bit lines BL. The dummy bit line DBL is arranged near the row decoder 13 in the end portion of the memory cell array 11 in the row direction. Further, the wiring length of the dummy bit line DBL is set substantially equal to that of the normal bit line BL. The wiring width of the dummy bit line DBL is set substantially equal to that of the normal bit line BL.

One end of the dummy bit line DBL is connected to the precharge circuit 16. Therefore, the precharge operation is also performed for the dummy bit line DBL in the same manner as that for the bit line BL. The other end of the dummy bit line DBL is connected to the input terminal of a signal generating circuit 18.

The signal generating circuit 18 is configured by an inverter circuit 18, for example. The inverter circuit 18 is configured by use of a complementary metal oxide semiconductor (CMOS) circuit, for example, and has threshold voltage of approximately VDD/2.

The inverter circuit 18 generates a sense amplifier activation signal SAE based on a variation in the potential level of the dummy bit line DBL. The sense amplifier activation signal SAE is supplied to the control terminal of each sense amplifier SA. When the potential of the dummy bit line DBL is set to the high level, the sense amplifier activation signal SAE is inverted by the inverter circuit 18 and set to the low level.

At this time, each of the sense amplifiers SA is not activated. That is, each sense amplifier SA does not amplify data of the bit line pair. On the other hand, when the potential of the dummy bit line DBL is set to the low level, the sense amplifier activation signal SAE is inverted by the inverter circuit 18 and it is set to the high level to activate each sense amplifier SA.

Figure 3:
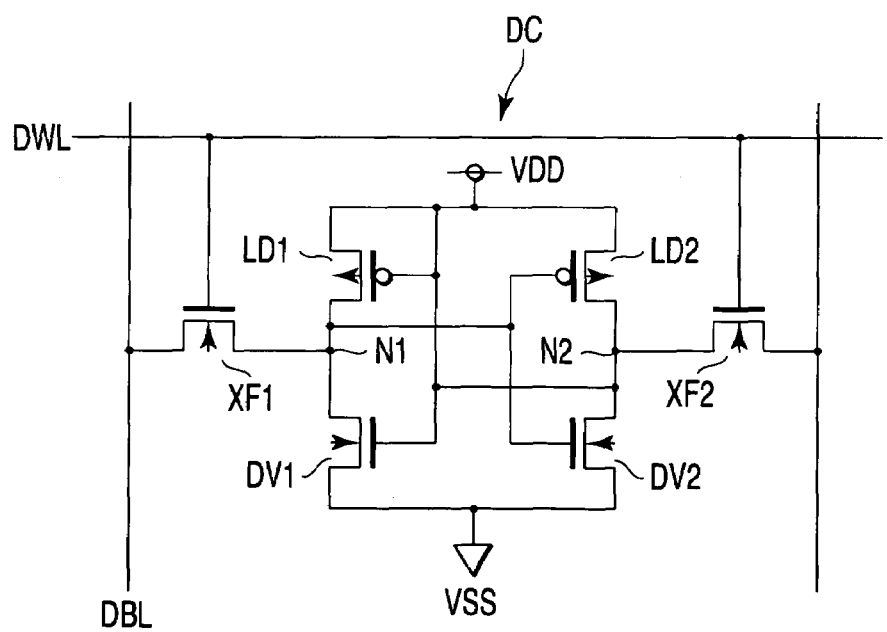
FIG. 3 is a circuit diagram illustrating the configuration of a dummy cell DC.

Next, the configurations of the dummy cells DC and DCN are explained. FIG. 3 is a circuit diagram illustrating the configuration of the dummy cell DC. Basically, the dummy cell has the same configuration as the memory cell MC. The configuration of the dummy cell which is different from that of the memory cell MC is mainly explained below.

The gate terminals of a driving NMOS transistor DV1 and load PMOS transistor LD1 are set at the power supply potential VDD. Therefore, the PMOS transistor LD1 is normally turned off and the NMOS transistor DV1 is normally turned on. That is, the flip-flop state of the dummy cell DC is fixed. In the dummy cell DC, low-level data ("0" data) is stored in a memory node N1 and high-level data ("1" data) is stored in a memory node N2.

The memory node N1 is connected to the dummy bit line DBL via a transfer NMOS transistor XF1. The gate terminals of the NMOS transistors XF1 and XF2 are connected to the dummy word line DWL. The source terminal of the NMOS transistor XF2 is connected to the memory node N2. The drain terminal of the NMOS transistor XF2 is set in the electrically floating state, for example.

In the dummy cell DC with the above configuration, the potential of the dummy bit line DBL is transited to the low level when the dummy cell DC is selected (the dummy word line DWL is activated). The dummy bit line DBL is formed of a wiring having the same resistance and the same capacitance as those of the normal bit line BL so as to cause the same delay as that of the normal bit line BL. Thus, the dummy bit line DBL reproduces the delay which occurs when the memory cell in the upper end of the bit line (the memory cell lying farthest from the sense amplifier circuit 15) is accessed.

Figure 4:
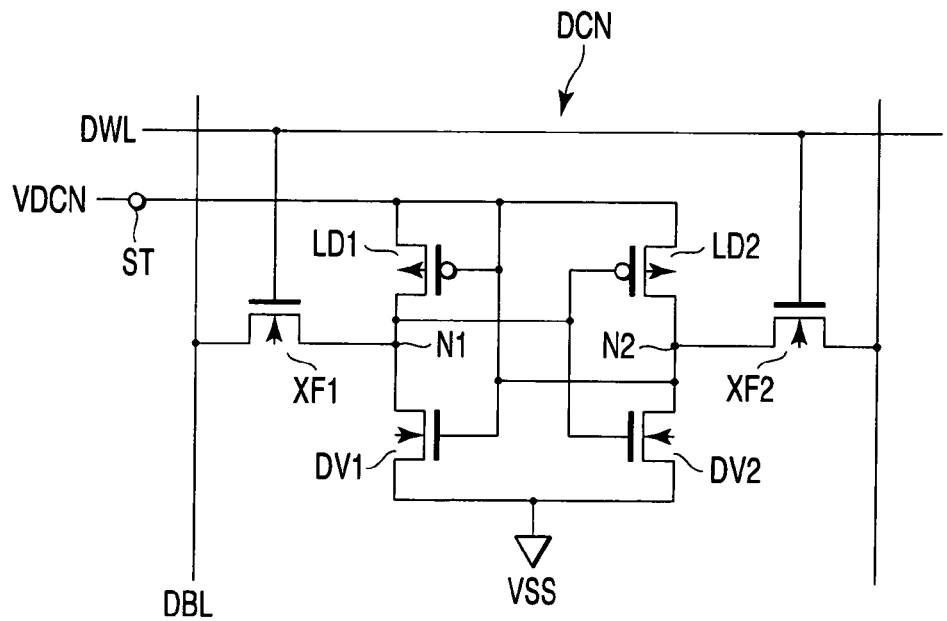
FIG. 4 is a circuit diagram illustrating the configuration of a dummy cell DCN.

FIG. 4 is a circuit diagram illustrating the configuration of the dummy cell DCN. The dummy cell DCN has basically the same configuration as the dummy cell DC. The dummy cell DCN is different from the dummy cell DC in that source potentials VDCN of the PMOS transistors LD1 and LD2 are supplied from the exterior instead of the power supply potential VDD. The dummy cell DCN has a source terminal ST to which the source potential VDCN is applied. The source terminal ST is connected to the source terminals of the PMOS transistors LD1 and LD2 and the memory node N2.

The source potential VDCN is generated from a source potential generating circuit 19 (in this embodiment, an NMOS transistor 19 is used). The source terminal of the NMOS transistor 19 is connected to the source terminal ST of the dummy cell DCN. The drain terminal of the NMOS transistor 19 is supplied with a precharge signal PREB. The gate terminal of the NMOS transistor 19 is set at the power supply potential VDD. Thus, the NMOS transistor 19 is normally turned on.

Therefore, in the precharge state (PREB=low level), the source potential VDCN is set at 0V, but the source potential VDCN is set to (VDD-Vth) when the precharge signal PREB is raised to the high level (VDD level) at the memory cell selection time. In this case, Vth indicates the threshold voltage of the NMOS transistor 19.

Therefore, in the dummy cell DCN, the gate terminal of the NMOS transistor DV1 which drives the dummy bit line DBL is biased to the potential (VDD-Vth) which is lower than that in the dummy cell DC by the threshold voltage Vth.

Figure 5:
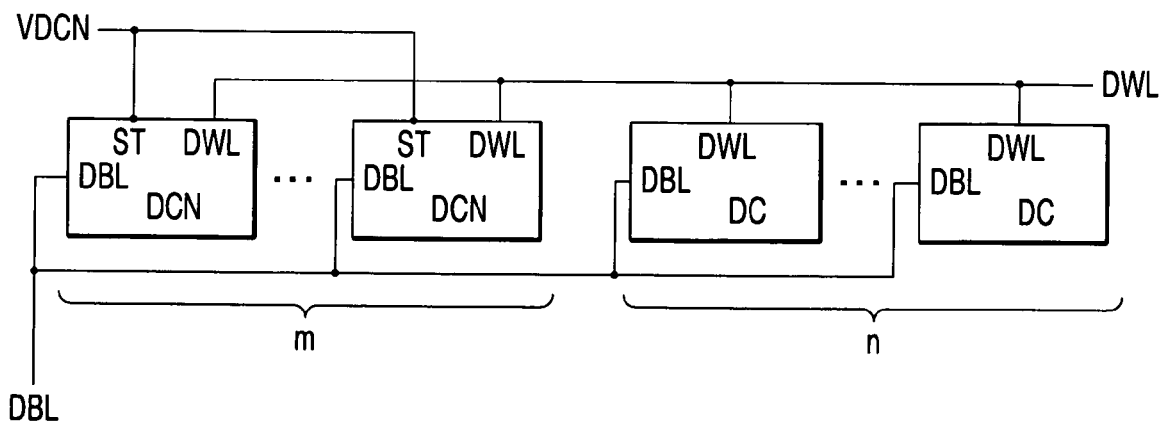
FIG. 5 is a diagram mainly illustrating the configurations of the dummy cells DC and dummy cells DCN.

In FIG. 1, only one dummy cell DC and one dummy cell DCN are shown for easy understanding, but in practice, a plurality of (m) dummy cells DCN and a plurality of (n) dummy cells DC are connected in parallel to the dummy word line DWL as shown in FIG. 5. By thus using a plurality of dummy cells, the amplitude of potential of the dummy bit line DBL can be increased and stabilized.

Figure 6:
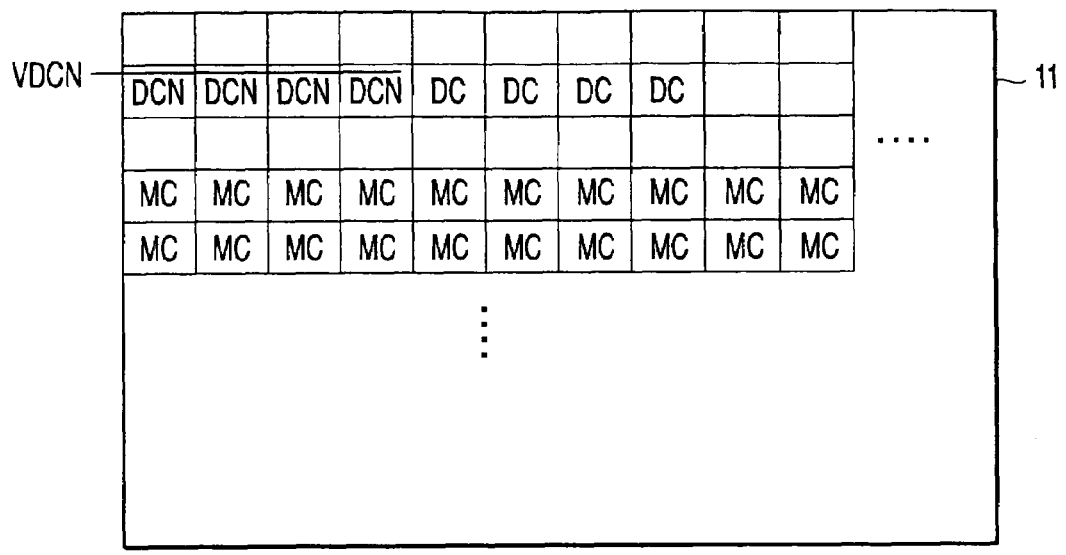
FIG. 6 is a diagram illustrating an example of the arrangement of the dummy cells DC and dummy cells DCN.

Further, as shown in FIG. 6, the arrangement of the dummy cells DC and DCN in the memory cell array 11 is made so that the source potential VDCN can be easily supplied by arranging the dummy cells DCN on the same row on the end side of the array.

Figure 7:
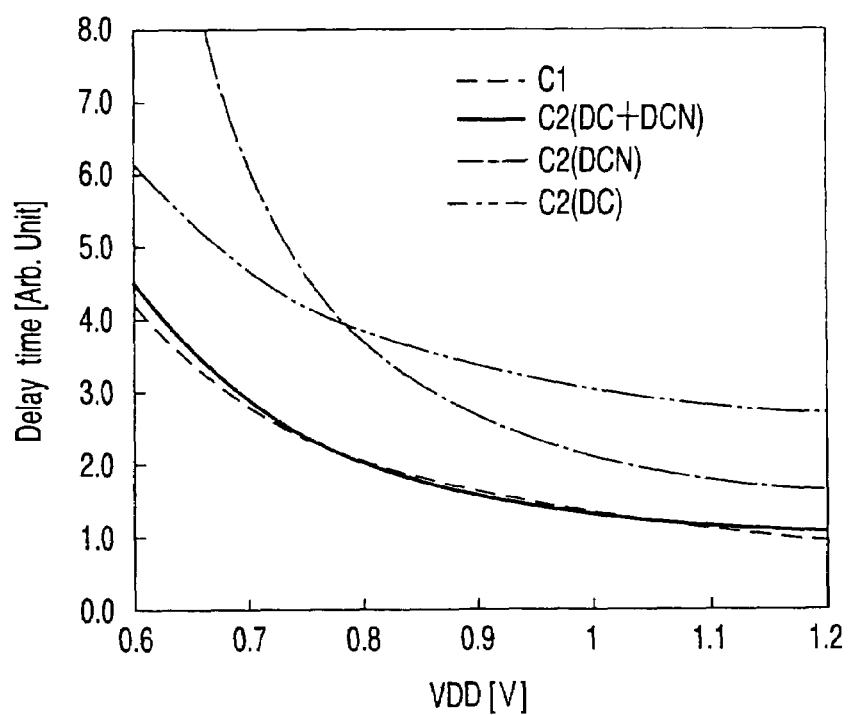
FIG. 7 is a diagram illustrating the dependency of the data path delay C1 and dummy bit line delay C2 of the SRAM on the power supply potential.

FIG. 7 is a diagram illustrating the dependency of the data path delay C1 and dummy bit line delay C2 of the SRAM on the power supply potential. The abscissa indicates the power supply potential VDD [V] and the ordinate indicates delay time [arbitrary unit: Arb. Unit]. The dummy bit line delay is a time period from the moment the potential of the dummy word line DWL is set to the high level until the time the potential of the dummy bit line DBL swings to the threshold voltage of the inverter circuit 18 (for example, approximately VDD/2). Further, the data path delay is a time period from the moment the potential of the word line WL is set to the high level until the time a potential difference (for example, approximately 100 mV) which can be sensed by the sense amplifier SA occurs between the paired bit lines.

In the present embodiment, both of the dummy cells DC and dummy cells DCN are used. In FIG. 7, the data path delay C1 and dummy bit line delay C2 (DC+DCN) obtained when the present embodiment is applied are shown. Further, in FIG. 7, the dummy bit line delay C2 (DC) when only the dummy cells DC are used and the dummy bit line delay C2 (DCN) when only the dummy cells DCN are used are also shown.

When only the dummy cells DC are used, the dummy bit line delay C2 (DC) becomes gradually longer as the power supply potential VDD is gradually lowered. On the other hand, when only the dummy cells DCN are used, the potential of the driving NMOS transistor DV1 becomes lower than that of the dummy cell DC by the threshold voltage Vth, and therefore, the drive current becomes rapidly smaller than in the dummy cell DC when the power supply potential VDD is gradually lowered. As a result, the dummy bit line delay C2 (DCN) becomes rapidly longer.

Since the minimum input potential difference required for the sense operation of the sense amplifier SA is caused by the input offset voltage or the like of the sense amplifier SA due to a fluctuation in the manufacturing process, it is kept substantially constant even if the power supply potential VDD is lowered. Therefore, if the input potential difference is reduced when the power supply potential VDD is low, an erroneous operation occurs in the SRAM.

In the present embodiment, the dummy cells DC and dummy cells DCN of a proper number are connected in parallel to the dummy word line DWL so as to attain the dummy bit line delay C2 (DC+DCN) as indicated by a curve shown in FIG. 7. Thus, the curve of the delay C2 (DC+DCN) substantially coincides with the curve of the data path delay C1. That is, the dummy bit line delay can be set to coincide with the data path delay by arbitrarily adjusting the number of two types of dummy cells (DC and DCN) having different characteristic curves of the dummy bit line delay.

As a result, the sense amplifier SA can always be operated at adequate timings irrespective of the power supply potential VDD. That is, it can be operated by use of the power supply potentials of a wide range without degrading the operation speed.

Next, the concrete configuration (layout) of the dummy cell DCN shown in FIG. 4 is explained. In the dummy cell DCN, the potential level of the drain terminal of the NMOS transistor DV1 is pulled up by the NMOS transistor XF1 and slightly rises from 0V at the dummy word line selection time. If the rise component is excessively large, the NMOS transistor NV2 will be turned on and a current path (through path) which penetrates from the source potential VDCN to the ground potential VSS via the NMOS transistor DV2 is formed.

If the above state occurs, there occurs a problem that the level of the source potential VDCN is lowered and the power consumption due to a through current increases. In order to cope with the above problem, part of the current path may be opened so as to prevent the through path extending from the source potential VDCN to the ground potential VSS from being made conductive. In this case, from the viewpoint of adjustment of the cell manufacturing condition, it is preferable to form the dummy cell to have the layout in common to the normal memory cell MC as far as possible.

Figure 8:
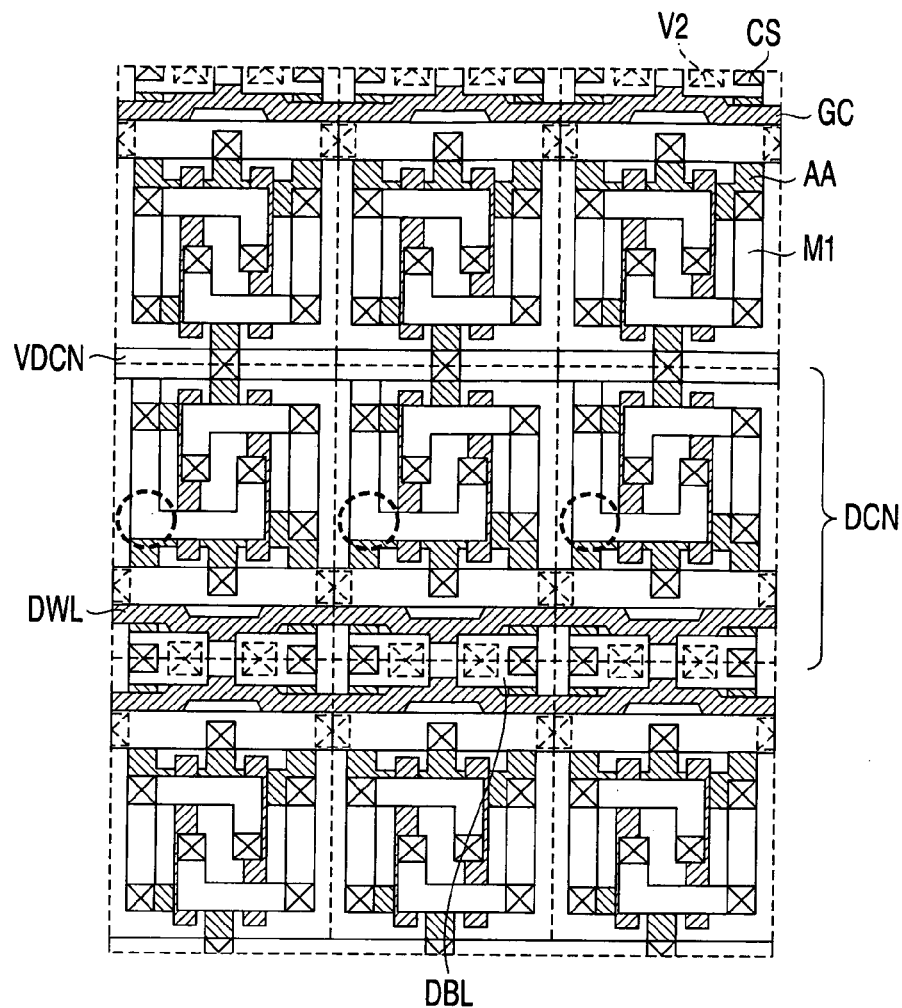
FIG. 8 is a layout diagram illustrating a dummy cell DCN when vertically long SRAM cells are used.

Various types of layouts of SRAM cells are provided, but examples of the configuration of the dummy cell DCN when the representative layouts of a vertically long type and horizontally long type are explained. FIG. 8 is a layout diagram illustrating a dummy cell DCN when vertically long SRAM cells are used.

In FIG. 8, GC denotes a gate electrode of a MOS transistor, AA an active area used as a source region or drain region of the MOS transistor, M1 a first-layered metal wiring layer, CS a contact, and V2 a via used for connection with the upper layer (second layer).

In the dummy cell DCN, a contact at a portion indicated by circular mark of broken line in FIG. 8 is omitted in the normal memory cell MC. The omitted contact is initially used to connect the drain region of the NMOS transistor DV2 to the drain of the PMOS transistor LD2 and the gate electrode of the NMOS transistor DV1 (and the gate electrode of the PMOS transistor LD1).

Figure 9:
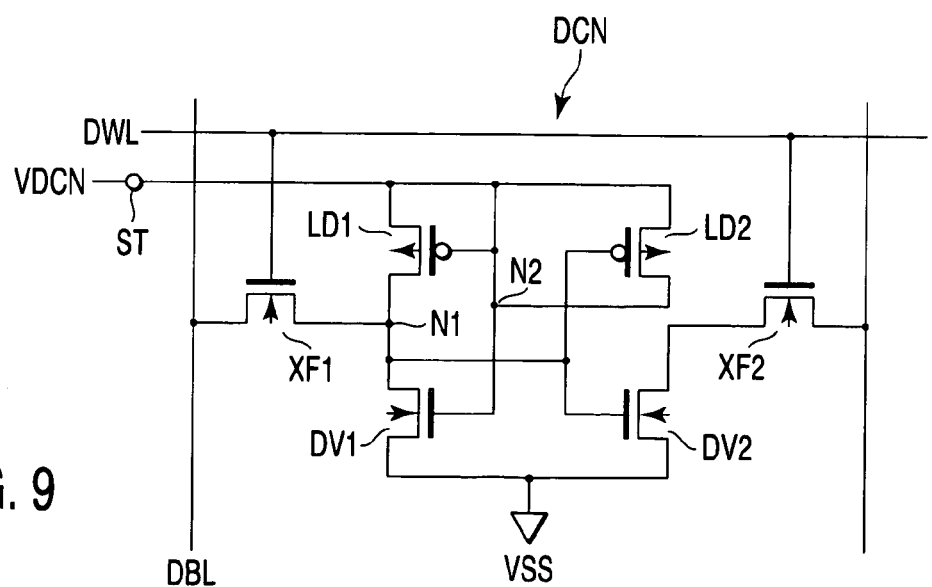
FIG. 9 is a circuit diagram of the dummy cell DCN shown in FIG. 8.

A circuit diagram of the dummy cell DCN attained at this time is shown in FIG. 9. The drain terminal of the NMOS transistor DV2 is connected only to the source terminal of the NMOS transistor XF2 and is not connected to the source potential VDCN line and the drain terminal of the PMOS transistor LD2. Thus, a through path from the source potential VDCN to the ground potential VSS is prevented from being formed.

FIG. 10 is a layout diagram illustrating a dummy cell DCN when horizontally long SRAM cells are used. In the dummy cell DCN, a via at a portion indicated by a circular mark of broken line in FIG. 10 is omitted in the normal memory cell MC. The omitted via is initially used to connect the source region of the NMOS transistor DV2 to the ground potential (VSS) line.

Figure 11:
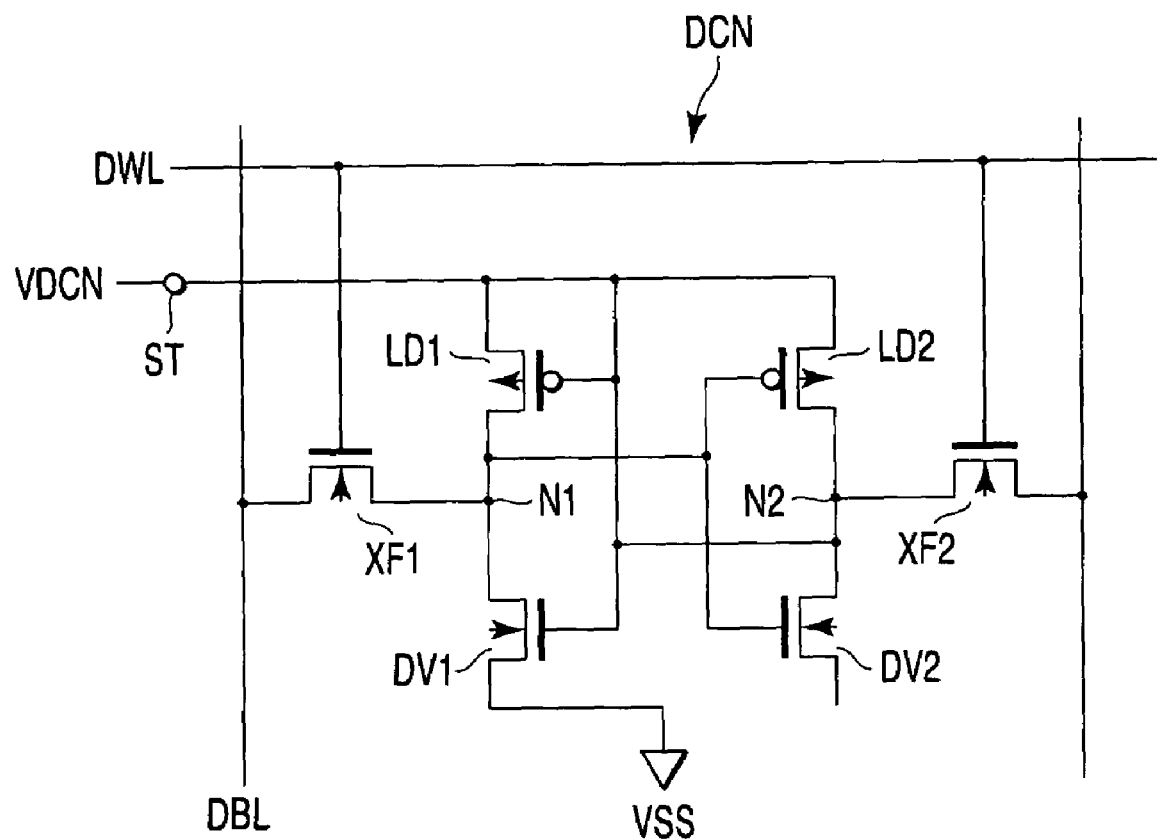
FIG. 11 is a circuit diagram of the dummy cell DCN shown in FIG. 10.

A circuit diagram of the dummy cell DCN attained at this time is shown in FIG. 11. The source terminal of the NMOS transistor DV2 is made open. As a result, formation of a through path from the source potential VDCN to the ground potential VSS is prevented.

As described above in detail, according to the present embodiment, the dummy bit line delay when the power supply potential VDD varies can be arbitrarily controlled by adjusting the number of dummy cells DC and dummy cells DCN. Therefore, the characteristic of the dummy bit line delay can be controlled and set to substantially coincide with the characteristic of the data path delay.

As a result, the sense amplifier SA can always be operated at optimum timing irrespective of the power supply potential VDD. Further, the sense amplifier SA can be operated by the power supply potentials of a wide range without degrading the operation speed.

The source potential VDCN supplied to the dummy cell DCN is generated by use of the NMOS transistor 19. That is, it is not necessary to additionally provide a large-scale circuit which generates the source potential VDCN. Thus, an increase in the circuit area when the present embodiment is applied can be suppressed.

In this embodiment, the source potential VDCN is generated by use of the NMOS transistor 19, but the configuration can be made so as to directly supply the source potential VDCN to the dummy cell DCN from the exterior.

SECOND EMBODIMENT

A plurality of potentials which are different from the power supply potential VDD can be used as the source potential VDCN. In a second embodiment of this invention, the dummy bit line delay is more finely adjusted in comparison with the first embodiment. For this purpose, a plurality of dummy cells DCN are divided into a plurality of groups and different source potentials are supplied to the plurality of groups.

Figure 12:
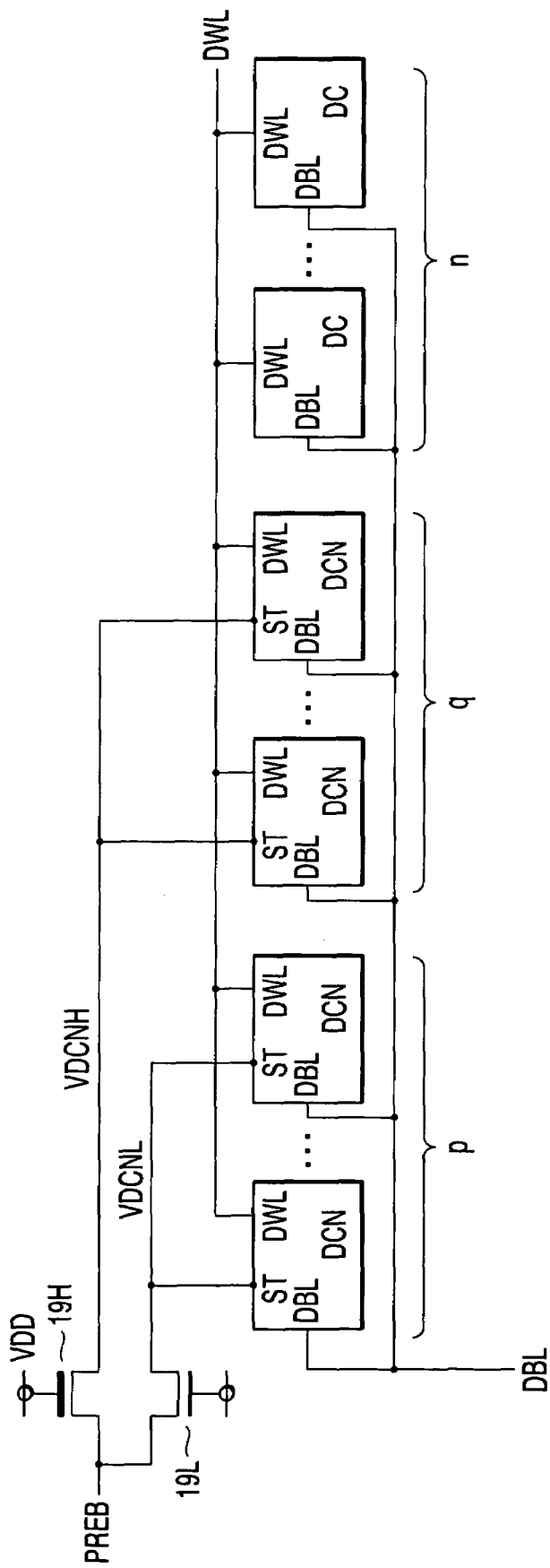
FIG. 12 is a diagram illustrating the configuration of a dummy cell portion and a peripheral circuit thereof contained in an SRAM according to a second embodiment of this invention.

FIG. 12 is a diagram illustrating the configuration of a dummy cell portion and a peripheral circuit thereof contained in an SRAM according to the second embodiment of this invention. A plurality of dummy cells DCN are configured by first and second groups. The first group includes a plurality of (p) dummy cells DCN and the second group includes a plurality of (q) dummy cells DCN.

The source terminals ST of the first group are set at first source potential VDCNH. The source terminals ST of the second group are set at second source potential VDCNL.

The first source potential VDCNH is generated by an NMOS transistor 19H. The source terminal of the NMOS transistor 19H is connected to the source terminals ST of the first group. The drain terminal of the NMOS transistor 19H is supplied with the precharge signal PREB. The gate terminal of the NMOS transistor 19H is set at the power supply potential VDD. Thus, the NMOS transistor 19H is normally turned on.

The second source potential VDCNL is generated by an NMOS transistor 19L. The source terminal of the NMOS transistor 19L is connected to the source terminals ST of the second group. The drain terminal of the NMOS transistor 19L is supplied with the precharge signal PREB. The gate terminal of the NMOS transistor 19L is set at the power supply potential VDD. Thus, the NMOS transistor 19L is normally turned on.

In this case, the NMOS transistors 19H and 19L have different threshold voltages. For example, the threshold voltage VthH of the NMOS transistor 19H is set higher than the threshold voltage VthL of the NMOS transistor 19L.

Therefore, in the precharged state (PREB=low level), each of the first source potential VDCHN and second source potential VDCNL is set at 0V. On the other hand, when the precharge signal PREB is set to a high level (VDD level) at the memory selection time, the first source potential VDCNH is set to (VDD-VthH) and the second source potential VDCNL is set to (VDD-VthL). As a result, the first source potential VDCNH is set to a level lower than that of the second source potential VDCNL.

That is, as the power supply potential VDD is gradually lowered, the drive current of the dummy cell DCN using the first source potential VDCNH as power supply potential is reduced at the earliest timing and then the drive current of the dummy cell DCN using the second source potential VDCNL as power supply potential is reduced. The drive current of the dummy cell DC using the power supply potential VDD as power supply potential is most smoothly reduced. As a result, as the power supply potential is gradually lowered, the dummy bit line delays become larger in the above order.

In the present embodiment, the three types of dummy cells of adequate numbers are connected in parallel. Thus, the dummy bit line delay when the power supply potential VDD varies can be arbitrarily controlled. Further, by using the three types of dummy cells, the dummy bit line delay can be more finely controlled in comparison with the case of the first embodiment.

THIRD EMBODIMENT

A third embodiment of this invention is to suppress a fluctuation in the operation of the sense amplifier SA with respect to a variation in the threshold voltage of the MOS transistor by taking the variation in the threshold voltage of the MOS transistor into consideration.

It is necessary to set the input potential difference at the sense amplifier activation time larger than the input offset voltage inherent to the sense amplifier. The input offset voltage of the sense amplifier occurs due to a variation in the elements caused in the manufacturing process.

Figure 13:
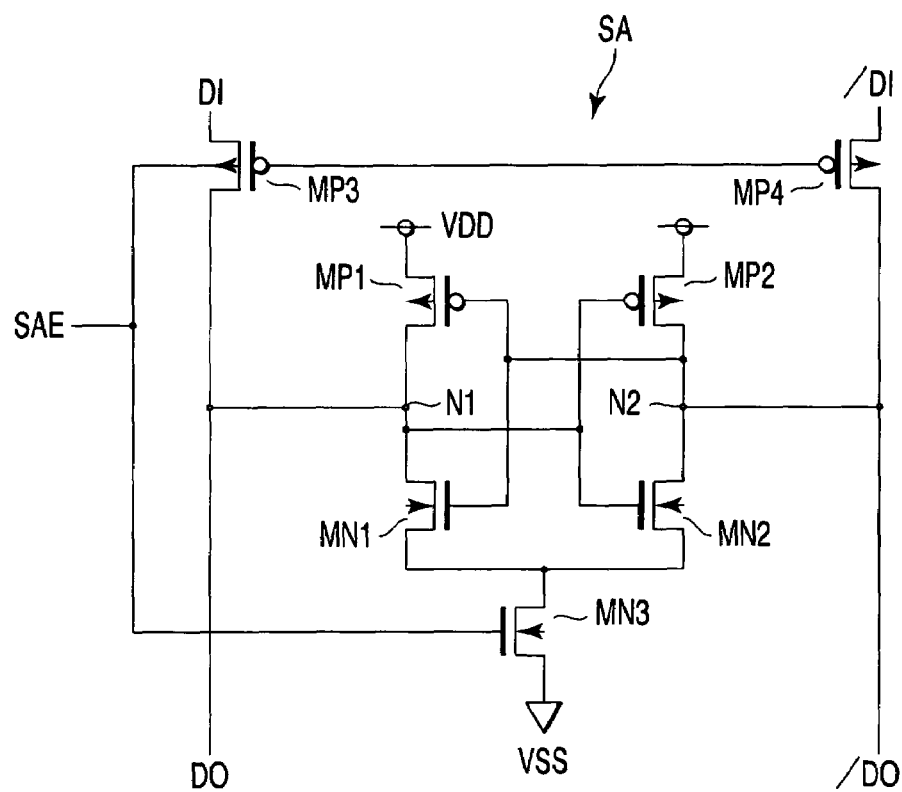
FIG. 13 is a circuit diagram illustrating the configuration of the main portion of a latch type sense amplifier SA.

FIG. 13 is a circuit diagram shown in the configuration of the main portion of a latch type sense amplifier SA. The sense amplifier SA includes first and second inverter circuits. The first inverter circuit includes a load PMOS transistor MP1 and driving NMOS transistor MN1. The PMOS transistor MP1 and NMOS transistor MN1 are serially connected between the power supply potential VDD and the ground potential VSS.

The second inverter circuit includes a load PMOS transistor MP2 and driving NMOS transistor MN2. The PMOS transistor MP2 and NMOS transistor MN2 are serially connected between the power supply potential VDD and the ground potential VSS.

Specifically, the source terminal of the PMOS transistor MP1 is set at the power supply potential VDD. The drain terminal of the PMOS transistor MP1 is connected to the drain terminal of the NMOS transistor MN1 via a memory node N1. The gate terminal of the PMOS transistor MP1 is connected to the gate terminal of the NMOS transistor MN1. The source terminal of the NMOS transistor MN1 is connected to the ground potential VSS line via an NMOS transistor MN3.

The source terminal of the PMOS transistor MP2 is set at the power supply potential VDD. The drain terminal of the PMOS transistor MP2 is connected to the drain terminal of the NMOS transistor MN2 via a memory node N2. The gate terminal of the PMOS transistor MP2 is connected to the gate terminal of the NMOS transistor MN2. The source terminal of the NMOS transistor MN2 is connected to the ground potential VSS line via the NMOS transistor MN3.

Further, the gate terminal of the PMOS transistor MP1 is connected to the memory node N2. The gate terminal of the PMOS transistor MP2 is connected to the memory node N1.

The memory node N1 is connected to a data line DO. The data line DO is connected to a data line DI via the PMOS transistor MP3. The memory node N2 is connected to a data line /DO. The data line /DO is connected to a data line /DI via a PMOS transistor MP4. The paired data lines DI, /DI are connected to paired bit lines BL, /BL via a column decoder 14.

The gate terminals of the PMOS transistors MP3, MP4 and NMOS transistor MN3 are supplied with the sense amplifier activation signal SAE. When the sense amplifier activation signal SAE is activated, the PMOS transistors MP3 and MP4 separate the sense amplifier SA from the bit lines.

In the sense amplifier SA with the above configuration, input offset voltage occurs due to a difference between the threshold voltages of the NMOS transistors MN1 and MN2. Generally, the threshold voltage of the MOS transistor is adjusted according to an impurity injection volume, but the threshold voltages of MOS transistors actually manufactured become different even if the MOS transistors are formed with the same plane shape.

Figure 14:
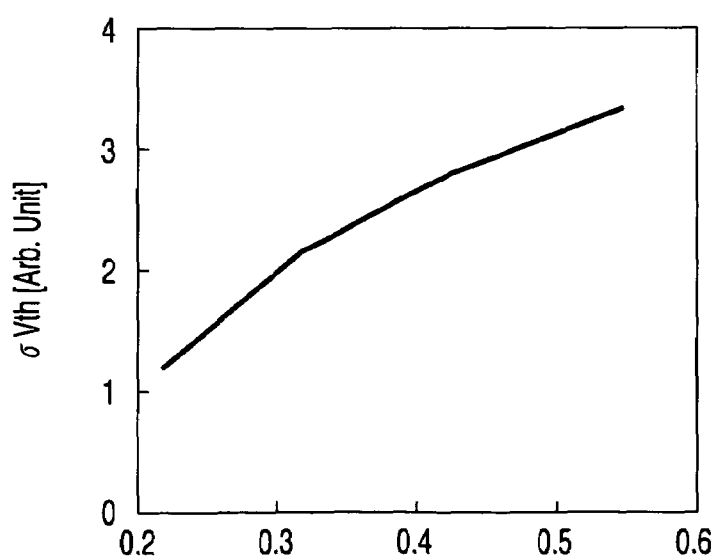
FIG. 14 is a diagram illustrating the relation between the threshold voltage of a MOS transistor and a variation range of the threshold voltage.

Further, it is known that the variation range of the threshold voltage (threshold value variation range) is correlated with the impurity concentration and the threshold value variation range becomes larger as the impurity concentration becomes higher. FIG. 14 is a diagram illustrating the relation between the threshold voltage of a MOS transistor and a variation range of the threshold voltage. The abscissa indicates the threshold voltage Vth [V] of the MOS transistor and the ordinate indicates the threshold value variation range σVth [arbitrary unit: Arb. Unit] of the MOS transistor. As shown in FIG. 14, the threshold value variation range tends to become larger as the impurity concentration becomes higher and the threshold voltage becomes higher.

In the present embodiment, the NMOS transistor 19 which generates the source potential VDCN as shown in FIG. 1 is formed to have channel length, channel width and plane shape substantially equal to those of the NMOS transistors MN1, MN2 of the sense amplifier SA. That is, a replica of the NMOS transistor MN1 or the like is used as the NMOS transistor 19. Thus, the threshold voltages of the NMOS transistors MN1, MN2 of the sense amplifier SA are reflected on the threshold voltage of the NMOS transistor 19.

When the threshold voltages of the NMOS transistors MN1, MN2 become higher due to a fluctuation in the manufacturing process, a threshold value variation range increases. Since the input offset voltage of the sense amplifier SA becomes higher if the threshold value variation range increases, a necessary input potential difference becomes larger.

In this embodiment, when the threshold voltages of the NMOS transistors MN1, MN2 become higher, the threshold voltage of the NMOS transistor 19 also becomes higher and the level of the source potential VDCN is lowered. Then, since the current drivability of the dummy cell DCN is lowered, the dummy bit line delay becomes long and the activation timing of the signal SAE is delayed. As a result, since it becomes possible to activate the sense amplifier SA in a state in which the input potential difference is large, the erroneous operation of the SRAM can be prevented.

Further, when the threshold voltages of the NMOS transistors MN1, MN2 become lower due to a fluctuation in the manufacturing process, the threshold value variation range is reduced. Since the input offset voltage of the sense amplifier SA is lowered if the threshold value variation range is reduced, a necessary input potential difference becomes smaller.

In the present embodiment, if the threshold voltages of the NMOS transistors MN1, MN2 become lower, the threshold voltage of the NMOS transistor 19 also becomes lower and the level of the source potential VDCN is raised. Then, since the current drivability of the dummy cell DCN is enhanced, the dummy bit line delay is reduced and the activation timing of the signal SAE is advanced. As a result, since the sense amplifier SA can be activated while the input potential difference is kept smaller, an unnecessary margin is not provided and higher operation speed can be attained.

As described above, according to this embodiment, setting of the timing of the signal SAE related to the threshold value variation of the sense amplifier SA can be made.

Figure 15:
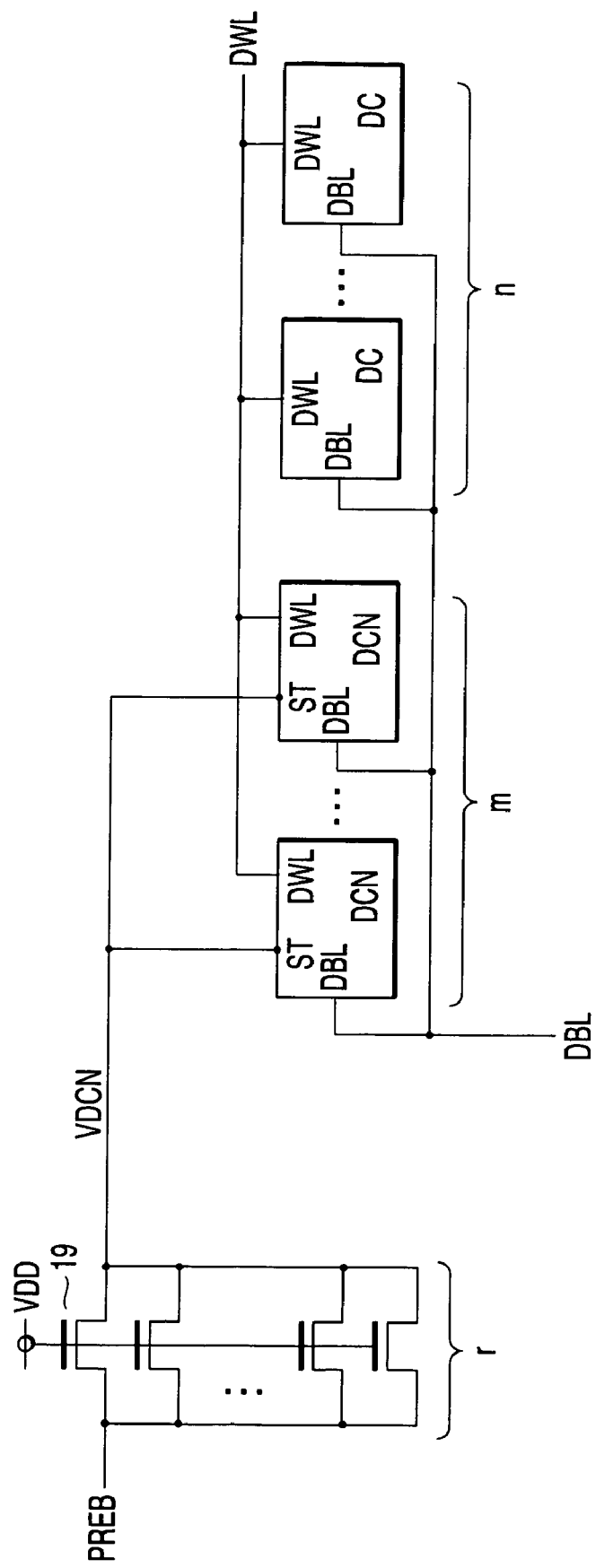
FIG. 15 is a diagram illustrating an example of the configuration when a plurality of NMOS transistors are used as a source potential generation circuit 19.

Further, when the NMOS transistor 19 is configured to be a replica of the NMOS transistors MN1, MN2 configuring the sense amplifier SA, there occurs a possibility that the level of the source potential VDCN will vary due to a threshold value variation of the NMOS transistor 19 itself. In this case, the level variation in the source potential VDCN can be suppressed by connecting a plurality of (r) replicas of the NMOS transistors MN1, MN2 in parallel as shown in FIG. 15.

FOURTH EMBODIMENT

As described before, the threshold voltage of the inverter circuit 18 which is connected to the dummy bit line DBL is set to approximately VDD/2, for example. Therefore, the inverter circuit 18 performs an inverting operation when the potential of the dummy bit line DBL becomes substantially equal to VDD/2. In this case, the potential level of the dummy bit line DBL is lowered together with the power supply potential VDD, but the input potential difference required by the sense amplifier SA which senses data of the bit line BL is not lowered along with the power supply potential VDD and is kept constant. That is, when the power supply potential VDD becomes lower, timing at which the sense amplifier activation signal SAE is activated is delayed.

A fourth embodiment of this invention is to generate an optimum sense amplifier activation signal SAE irrespective of the threshold voltage of the inverter circuit 18 by detecting the timing at which the potential amplitude of the dummy bit line DBL is set to a constant level.

Figure 16:
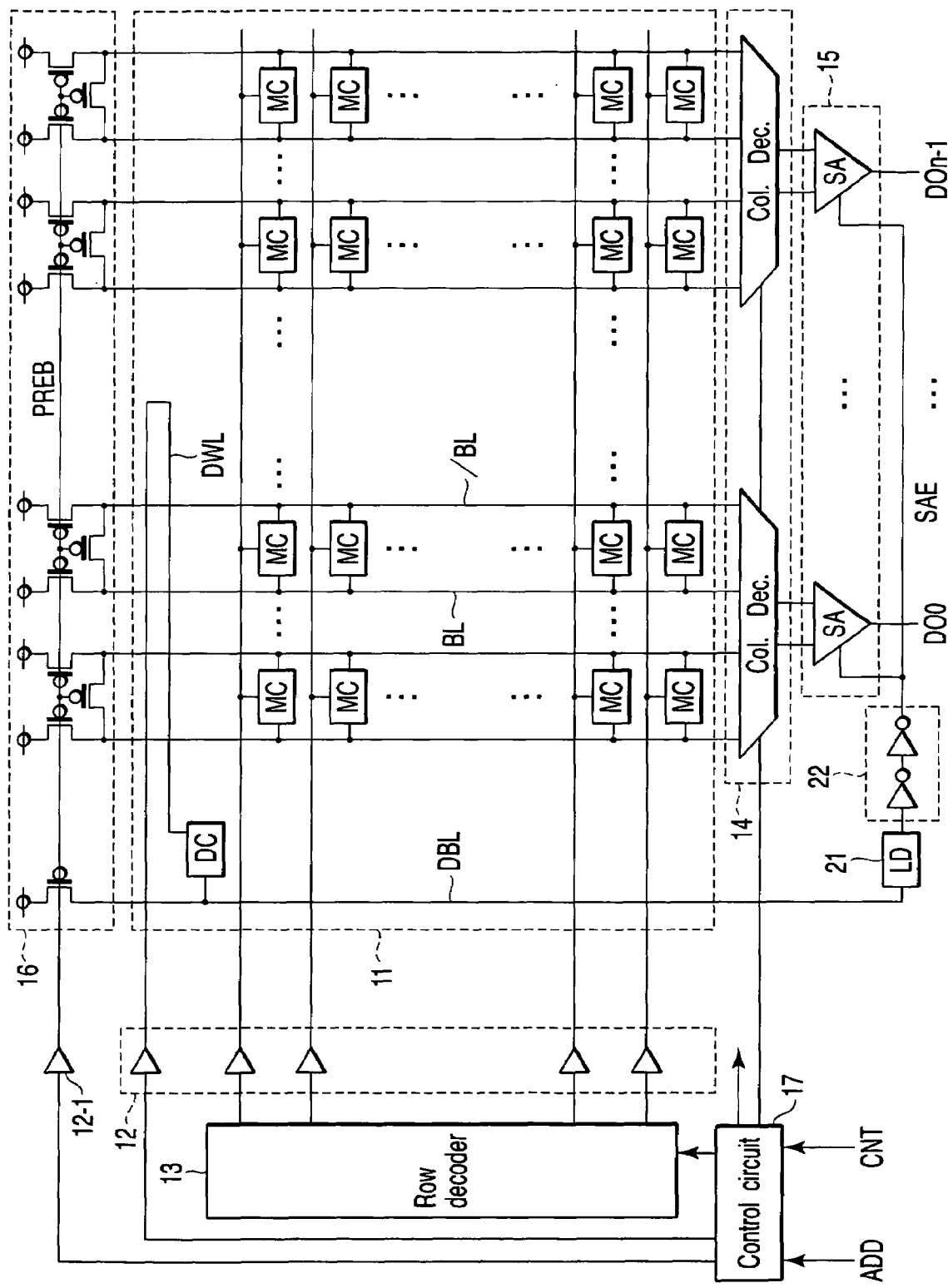
FIG. 16 is a block diagram illustrating the configuration of an SRAM according to a fourth embodiment of this invention.

FIG. 16 is a block diagram illustrating the configuration of an SRAM according to the fourth embodiment of this invention. A plurality of (n) dummy cells DC are connected in parallel to a dummy word line DWL. In FIG. 16, only one dummy cell DC is shown for easy understanding. As described before, the dummy cell DC is supplied with power supply potential VDD.

Each dummy cell DC is connected to a dummy bit line DBL. By thus using a plurality of dummy cells DC, the amplitude of the potential of the dummy bit line DBL is increased and stabilized.

The other end of the dummy bit line DBL is connected to the input terminal of a level detection circuit (LD) 21. The level detection circuit 21 generates a sense amplifier activation signal SAE based on a variation in the potential level of the dummy bit line DBL. The sense amplifier activation signal SAE is supplied to the control terminal of each sense amplifier SA via a buffer circuit 22.

For example, the buffer circuit 22 is configured by serially connecting two inverter circuits. The buffer circuit 22 is configured by use of a CMOS circuit, for example, and has a threshold voltage of approximately VDD/2.

Figure 17:
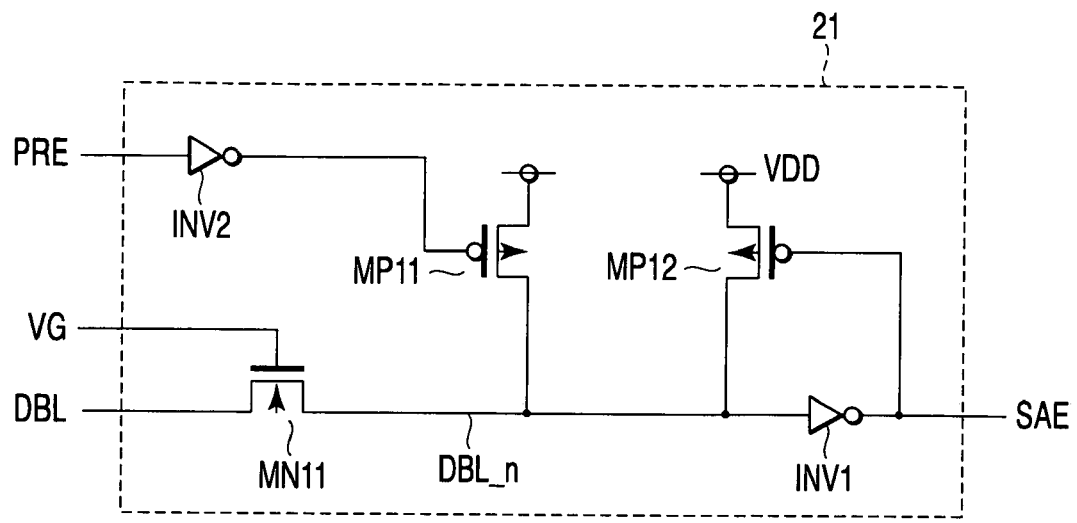
FIG. 17 is a circuit diagram illustrating the configuration of a level detection circuit 21 according to the fourth embodiment.

FIG. 17 is a circuit diagram illustrating the configuration of the level detection circuit 21. The level detection circuit 21 includes an NMOS transistor MN11, PMOS transistors MP11, MP12 and inverter circuits INV1, INV2.

The source terminal of the NMOS transistor MN11 is connected to the dummy bit line DBL. The drain terminal of the NMOS transistor MN11 is connected to the input terminal of the inverter circuit INV1 via a data line DBL_n. The gate terminal of the NMOS transistor MN11 is set at gate potential VG. The gate potential VG is the power supply potential VDD, for example. The gate potential VG is not limited to the power supply potential VDD and can be set to desired potential. When potential other than the power supply potential is used, for example, the configuration is made to supply desired potential from the exterior.

Further, the input terminal of the inverter circuit INV1 is connected to the drain terminal of the PMOS transistor MP11. The source terminal of the PMOS transistor MP11 is set at the power supply potential VDD.

The level detection circuit 21 is supplied with a precharge signal PRE from the control circuit 17. The precharge signal PRE is set to the high level in the precharged state and set to the low level in the non-precharged state. That is, the precharge signal PRE is an inverted signal of the precharge signal PREB explained in the first embodiment. The precharge signal PRE is supplied to the gate terminal of the PMOS transistor MP11 via the inverter circuit INV2.

Further, the input terminal of the inverter circuit INV1 is connected to the drain terminal of the PMOS transistor MP12. The source terminal of the PMOS transistor MP12 is set at the power supply potential VDD. The gate terminal of the PMOS transistor MP12 is connected to the output terminal of the inverter circuit INV1. A sense amplifier activation signal SAE is output from the output terminal of the inverter circuit INV1 via the buffer circuit 22.

Next, the operation of the level detection circuit 21 with the above configuration is explained. In the precharged state (PRE=H), the PMOS transistor MP11 is turned on. Therefore, the power supply potential VDD is applied to the input terminal of the inverter circuit INV1. As a result, an output of the inverter circuit INV1 is set at the low level (0V).

On the other hand, in the non-precharged state (PRE=L), the PMOS transistor MP11 is turned off. However, since an output of the inverter circuit INV1 is set at the low level, the PMOS transistor MP12 is turned on. Therefore, the power supply potential VDD is kept applied to the input terminal of the inverter circuit INV1.

After this, the potential of the dummy bit line DBL is gradually lowered from the precharge potential (VDD) by the dummy cell DC. When the potential is lowered to the level of (VG-Vth(MN11)), the NMOS transistor MN11 is turned on. In this case, Vth(MN11) is the threshold voltage of the NMOS transistor MN11. Then, the potential of the input terminal of the inverter circuit INV1 is set to the low level, and therefore, an output of the inverter circuit INV1 is set to the high level.

When the output of the level detection circuit 21 is set to the high level, a high level signal SAE is supplied to the control terminal of the sense amplifier SA via the buffer circuit 22. As a result, the sense amplifier circuit 15 is activated.

Figure 18:
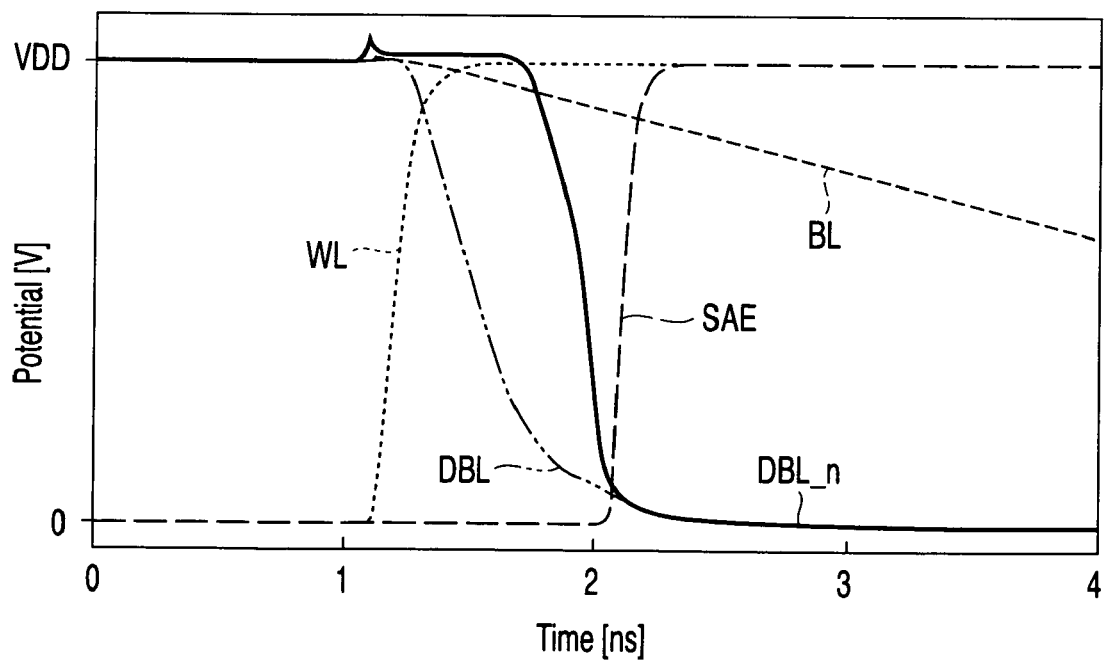
FIG. 18 is a waveform diagram illustrating the operation of the SRAM of the fourth embodiment.

FIG. 18 is a waveform diagram illustrating the operation of the SRAM of the fourth embodiment. The abscissa indicates time [ns] and the ordinate indicates potential [V]. When the word line is activated (set to the high level), a potential difference gradually appears between the paired bit lines BL and /BL. In FIG. 18, a case wherein data "0" is transferred to the bit line BL is shown.

At this time, the potential level of the dummy bit line DBL is lowered, but the potential of the data line DBL_n is kept at the high level until the NMOS transistor MN11 is turned on. When the potential level of the dummy bit line DBL is lowered to (VG-Vth(MN11)), the potential of the data line DBL_n is set to the low level and the sense amplifier activation signal SAE is set to the high level.

Therefore, in the case of VG=VDD, the sense amplifier SA is activated at timing at which the potential amplitude of the dummy bit line DBL is set to Vth(MN11) irrespective of the power supply potential VDD. Thus, it becomes possible to detect the timing at which the potential of the dummy bit line DBL comes to have constant amplitude which does not depend on the power supply potential VDD.

As described above in detail, according to the present embodiment, it becomes possible to detect that the potential of the dummy bit line DBL is set to have the constant potential amplitude (which is the threshold voltage of the NMOS transistor MN11 in the present embodiment) which is independent of the power supply potential VDD. Then, based on the detection result, the sense amplifier activation signal SAE is activated.

As a result, it becomes possible to always operate the sense amplifier SA at optimum timing irrespective of the power supply potential VDD. Further, the sense amplifier SA can be operated by the power supply potentials of a wide range without degrading the operation speed.

When the power supply potential VDD is gradually lowered, it becomes possible to prevent occurrence of a problem that the data path delay becomes rapidly longer than the dummy bit line delay. Therefore, it becomes possible to prevent occurrence of a problem that the input potential-difference to the sense amplifier SA is more reduced as the power supply potential VDD becomes lower.

Further, even when the gate potential VG of the NMOS transistor MN11 is not equal to the power supply potential VDD, the same effect can be attained if bias voltage having a constant potential difference with respect to the power supply potential VDD is used.

The third embodiment can be applied to the fourth embodiment. Specifically, the NMOS transistor MN11 is formed with channel length, channel width and plane shape substantially equal to those of the NMOS transistors MN1, MN2 of the sense amplifier SA (FIG. 13). That is, a replica of the NMOS transistor MN1 or the like is used as the NMOS transistor MN11.

With the above configuration, the threshold voltages of the NMOS transistors MN1, MN2 of the sense amplifier SA are reflected on the threshold voltage of the NMOS transistor MN11. As a result, the SAE timing associated with the threshold value variation range of the sense amplifier SA can be set.

When the NMOS transistor MN11 is configured by a replica of the NMOS transistors MN1, MN2 which configure the sense amplifier SA, there occurs a possibility that the detection level varies due to a threshold value variation of the NMOS transistor MN11 itself. In this case, a variation in the detection level can be suppressed by connecting a plurality of replicas of each of the NMOS transistors MN1, MN2 in parallel.

FIFTH EMBODIMENT

A fifth embodiment of this invention is to detect constant potential amplitude of the dummy bit line DBL by use of a value different from that of the fourth embodiment and activate the sense amplifier activation signal SAE.

FIG. 19 is a circuit diagram illustrating the configuration of a level detection circuit 21 according to the fifth embodiment. The gate terminal of a NMOS transistor MN12 is set at power supply potential VDD.

Therefore, the NMOS transistor MN12 is normally turned on. The drain terminal of the NMOS transistor MN12 is connected to the output terminal of an inverter circuit INV2. The source terminal of the NMOS transistor MN12 is connected to the gate terminal of an NMOS transistor MN11.

Next, the operation of the level detection circuit 21 thus configured is explained. When the precharged state (PRE=H) is changed to the non-precharged state (PRE=L), an output of the inverter circuit INV2 is changed from the low level (0V) to the high level (VDD). Then, the gate potential of the NMOS transistor MN11 gradually rises from 0V since the NMOS transistor MN12 is turned on.

After this, when the gate potential of the NMOS transistor MN11 is set to a level of (VDD-Vth(MN12)), the NMOS transistor MN12 is turned off. In this case, Vth(MN12) is the threshold voltage of the NMOS transistor MN12. Therefore, the gate potential of the NMOS transistor MN11 is set to (VDD-Vth(MN12)).

As a result, the potential level of the dummy bit line DBL is gradually lowered from the power supply potential VDD and when it is set to a level of (VDD-Vth(MN11)-Vth(MN12)), the NMOS transistor MN11 is turned on. Therefore, an output of the inverter circuit INV1 is inverted and the sense amplifier activation signal SAE is set to the high level.

Thus, according to the present embodiment, it becomes possible to detect timing at which the potential level of the dummy bit line DBL swings by potential which is equal to approximately twice the threshold voltage of the NMOS transistor. Further, by using the configuration of the fifth embodiment, the desired gate potential VG applied to the gate terminal of the NMOS transistor MN11 as in the fourth embodiment becomes unnecessary.

The third embodiment can be applied to the fifth embodiment. That is, a replica of the NMOS transistor MN1 or the like of the sense amplifier SA can be used as the NMOS transistors MN11, MN12.

SIXTH EMBODIMENT

In the fourth and fifth embodiments, the level detection process using the threshold voltage of the NMOS transistor as a reference can be performed, but an adequate level may be determined depending on the power supply potential VDD and threshold voltage set, the configuration of the memory and the like. Therefore, there occurs a possibility that optimum level setting cannot be attained by use of the methods shown in the fourth and fifth embodiments in some cases.

A sixth embodiment of this invention is to configure a level detection circuit 21 by combining the fourth and fifth embodiments.

FIG. 20 is a circuit diagram illustrating the configuration of the level detection circuit 21 according to the sixth embodiment. An NMOS transistor MN13 is connected in parallel with an NMOS transistor MN11. That is, the source terminal of the NMOS transistor MN13 is connected to a dummy bit line DBL. The drain terminal of the NMOS transistor MN13 is connected to a data line DBL_n.

The gate terminal of the NMOS transistor MN13 is set at the power supply potential VDD, for example. The gate potential of the NMOS transistor MN13 is not limited to the power supply potential VDD and can be set to desired potential. When potential other than the power supply potential VDD is used, the configuration is made to supply desired potential from the exterior, for example.

The effect of the above configuration is explained with reference to FIG. 21. FIG. 21 is a diagram illustrating the dependency of the bit line potential difference $\Delta Vb1$ at the sense amplifier activation time on the power supply potential. The abscissa indicates the power supply potential [V] and the ordinate indicates the bit line potential difference $\Delta Vb1$ [arbitrary unit: Arb. Unit].

With the configuration of the fifth embodiment, since it is detected that the potential of the dummy bit line DBL swings by the potential which is equal to twice the threshold voltage by use of the NMOS transistor MN11, the bit line potential difference $\Delta Vb1$ is not reduced even when the power supply potential VDD is gradually lowered as shown in FIG. 21. In this case, conversely, $\Delta Vb1$ rises and a problem that the SRAM is erroneously operated due to a lowering in the power supply potential does not occur. However, since $\Delta Vb1$ rises more than necessary along with a lowering in the power supply potential, there occurs a possibility that the operation speed is lowered.

With the configuration of the fourth embodiment, since it is detected that the potential of the dummy bit line DBL swings by the potential which is equal to the threshold voltage by use of the NMOS transistor MN11, $\Delta Vb1$ is reduced with a lowering in the power supply potential as shown in FIG. 21.

In the present embodiment, a combination of the fourth embodiment and fifth embodiment is used. Therefore, an intermediate characteristic between the curves of the fourth and fifth embodiments can be attained as shown in FIG. 21 by using the level detection circuit 21 of the present embodiment. Thus, the bit line potential difference $\Delta Vb1$ is kept constant irrespective of the power supply potential VDD.

Further, the third embodiment can be applied to the sixth embodiment. That is, a replica of the NMOS transistor MN1 or the like of the sense amplifier SA can be used for the NMOS transistor MN11, MN12, MN13.

As explained in each of the above embodiments, even when the SRAM shown in the first to sixth embodiments is supplied with plural types of power supply potentials VDD, the sense amplifier SA can always be operated at optimum timing. This is because the SRAM to which the first to sixth embodiments are applied can permit the sense amplifier SA to be always operated at optimum timing without depending on the power supply potential VDD.

For example, in order to reduce the power consumption, an SRAM is used in some cases while the level of the power supply potential VDD is switched when the SRAM performs the high-speed data process and when it performs the low-speed data process. At this time, the level of the power supply potential VDD is raised when the high-speed data process is performed and the level of the power supply potential VDD is lowered when the high-speed data process is performed.

When the SRAM shown in the first to sixth embodiments is mounted on a chip which performs the above control operation, the sense amplifier SA can be operated at optimum timings for plural types of power supply potentials VDD.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array including a plurality of memory cells, each memory cell being of a static type and configured by metal insulator semiconductor (MIS) transistors;
   a plurality of word lines which select the memory cells;
   a plurality of bit lines which transfer data of the memory cells;
   a sense amplifier circuit which amplifies data transferred to the bit lines;

a first dummy cell group including a plurality of first dummy cells, each first dummy cell being configured by MIS transistors and having data fixed therein;

a dummy word line which selects the first dummy cell group;

a dummy bit line to which data of the first dummy cell group is transferred;

a generation circuit which generates an activation signal to activate the sense amplifier circuit based on a variation in a potential level of the dummy bit line; and a potential generating circuit which generates a first source potential applied to the first dummy cell group, wherein a power supply potential is applied to the memory cells; and the first source potential is lower than the power supply potential, and the first source potential is not a ground potential.

2. The semiconductor memory device according to claim 1, further comprising a second dummy cell group which includes a plurality of second dummy cells, each second dummy cell being configured by MIS transistors and having data fixed therein, wherein:

the dummy word line selects the first and second dummy cell groups;

data of the first and second dummy cell groups are transferred to the dummy bit line; and the power supply potential is applied to the second dummy cell group.

3. The semiconductor memory device according to claim 2, wherein each of the first and second dummy cells is configured by MIS transistors equal in size to the MIS transistors of the memory cell.

4. The semiconductor memory device according to claim 1, wherein:

the potential generating circuit includes a first N-type MIS transistor; and the first source potential is set to a potential attained by subtracting a threshold voltage of the first MIS transistor from the power supply potential.

5. The semiconductor memory device according to claim 4, further comprising a precharge circuit which precharges the bit lines to a preset potential before the memory cells are selected, and to which a precharge signal is supplied, wherein:

the precharge signal is set at a low level at a precharge mode and set at a high level at a non-precharge mode;

the precharge signal is supplied to a drain terminal of the first MIS transistor;

the power supply potential is applied to a gate terminal of the first MIS transistor; and a source terminal of the first MIS transistor is connected to the first dummy cell group.

6. The semiconductor memory device according to claim 4, further comprising a third dummy cell group which includes a plurality of third dummy cells, each third dummy cell being configured by MIS transistors and having data fixed therein, wherein:

the potential generation circuit supplies a second source potential to the third dummy cell group, and includes a second N-type MIS transistor having a threshold voltage different from the threshold voltage of the first MIS transistor;

the second source potential is set to a potential obtained by subtracting the threshold voltage of the second MIS transistor from the power supply potential;

the dummy word line selects the first and third dummy cell groups; and data of the first and third dummy cell groups are transferred to the dummy bit line.

7. The semiconductor memory device according to claim 4, wherein:

the sense amplifier circuit includes third N-type MIS transistors; and the first MIS transistor has a threshold voltage equal to a threshold voltage of the third MIS transistors.

8. The semiconductor memory device according to claim 1, wherein:

the first dummy cell includes a driving MIS transistor, a load MIS transistor and a transfer MIS transistor;

the load MIS transistor has source and gate terminals to which the source potential is applied;

the load MIS transistor has a drain terminal connected to a drain terminal of the driving MIS transistor via a memory node;

the driving MIS transistor has a gate terminal to which the source potential is applied; the driving MIS transistor has a source terminal to which the ground potential is applied;

the memory node is connected to the dummy bit line via the transfer MIS transistor; and the transfer MIS transistor has a gate terminal connected to the dummy word line.

9. The semiconductor memory device according to claim 2, wherein:

the second dummy cell includes a driving MIS transistor, a load MIS transistor and a transfer MIS transistor;

the load MIS transistor has source and gate terminals to which the power supply potential is applied;

the load MIS transistor has a drain terminal connected to a drain terminal of the driving MIS transistor via a memory node;

the driving MIS transistor has a gate terminal to which the power supply potential is applied;

the driving MIS transistor has a source terminal to which the ground potential is applied;

the memory node is connected to the dummy bit line via the transfer MIS transistor; and the transfer MIS transistor has a gate terminal connected to the dummy word line.

10. The semiconductor memory device according to claim 1, wherein the dummy word line is activated at substantially a same time as the word lines.

11. The semiconductor memory device according to claim 1, wherein:

the dummy bit line has a wiring length and a wiring width equal to a wiring length and a wiring width of the bit lines; and the dummy word line has a wiring length and a wiring width equal to a wiring length and a wiring width of the word lines.

12. The semiconductor memory device according to claim 1, wherein:

the memory cell includes two inverter circuits;

an output of one inverter circuit is connected to an input of the other inverter circuit;

each of the two inverter circuits includes a driving MIS transistor, a load MIS transistor and a transfer MIS transistor;

the load MIS transistor has a source terminal to which the power supply potential is applied, a gate terminal connected to a gate terminal of the driving MIS transistor, and a drain terminal connected to a drain terminal of the driving MIS transistor via a memory node;

the driving MIS transistor has a source terminal to which the ground potential is applied; and the transfer MIS transistor is connected between the memory node and one of the bit lines, and has a gate terminal connected to one of the word lines.

13. The semiconductor memory device according to claim 1, wherein a change of a dummy bit line delay is larger than that of a bit line delay when the power supply potential varies.

* * * * *